US008581167B2

(12) United States Patent
Lean et al.

(10) Patent No.: US 8,581,167 B2
(45) Date of Patent: Nov. 12, 2013

(54) OPTICALLY PATTERNED VIRTUAL ELECTRODES AND INTERCONNECTS ON POLYMER AND SEMICONDUCTIVE SUBSTRATES

(75) Inventors: Meng H. Lean, Santa Clara, CA (US); David K. Biegelsen, Santa Clara, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 299 days.

(21) Appl. No.: 12/947,004

(22) Filed: Nov. 16, 2010

(65) Prior Publication Data

US 2012/0119072 A1 May 17, 2012

(51) Int. Cl.
*H01L 27/00* (2006.01)

(52) U.S. Cl.
USPC .................................... 250/208.1; 250/214 R

(58) Field of Classification Search
USPC .............. 250/208.1, 214 R, 239; 324/754.23, 324/762.02, 750.3; 257/290–292, 300–312; 438/18, 763
See application file for complete search history.

(56) References Cited

U.S. PATENT DOCUMENTS

| | | | | |
|---|---|---|---|---|
| 5,216,359 | A * | 6/1993 | Makki et al. | 324/754.23 |
| 7,612,355 | B2 * | 11/2009 | Wu et al. | 250/559.04 |
| 8,305,505 | B2 | 11/2012 | Lean et al. | |

OTHER PUBLICATIONS

Chiou et al., "Massively Parallel Manipulation of Single Cells and Microparticles Using Optical Images", Nature, vol. 436, Jul. 21, 2005, pp. 370-372.

* cited by examiner

*Primary Examiner* — Que T Le
(74) *Attorney, Agent, or Firm* — Fay Sharpe LLP

(57) ABSTRACT

An optical electrical system that converts a photo image pattern to a conductance pattern comprises a photoconductive layer for receiving light image patterns and a conversion layer for converting an electrostatic voltage into a conductance pathway for a current flow. The light image pattern can be generated into a page sized area and generated from a light source comprising an array of projectors coupled together.

18 Claims, 9 Drawing Sheets

OPTICALLY PATTERNED VIRTUAL ELECTRODES AND INTERCONNECTS ON POLYMER AND SEMICONDUCTIVE SUBSTRATES

BACKGROUND

The present disclosure relates to apparatus and methods for optically patterned layouts on re-usable substrates. More specifically, the present disclosure provides for application of optically patterned layouts to the development of electronic devices.

Electronic devices that carry electrodes and/or interconnect structures are manufactured by going through a series of fabrication processes such as photo-lithography, etching and drilling, among others. This results in pre-fabricated devices having a fixed physical arrangement. Such a development system is quite costly and the resulting devices are inflexible. Therefore, a need arises for methods and apparatus to improve the construction of devices which include electrodes and interconnects by making them less costly and more adaptable.

BRIEF DESCRIPTION

Optical devices comprise optically patterned layouts on general purpose re-usable substrates. The optical devices employ an optoelectronic system to create large-scale dynamically reconfigurable virtual electrodes and interconnects on polymer photoconductive and/or semiconductive substrates. Wide voltage latitudes and high current conductivity pathways that can function over wide areas are provided.

DETAILED DESCRIPTION

Electronic devices (e.g., such as integrated circuits) are pre-fabricated devices. For example, semiconductor fabrication techniques such as masking, etching, and other process techniques are known to be used to create electrode and interconnect patterns to connect discrete devices, or other components on a surface, such as a circuit board surface. The various fabrication steps result in manufacturing that is known to be expensive and time consuming.

Optoelectronics has been shown to be used to generate Optical Tweezers, in an article by P. Y. Chiou, A. T. Ohta and M. C. Wu, entitled, “Massively Parallel Manipulation of Single Cells and Microparticles Using Optical Images,” *Nature,* 436, July, 2005, which was directed to precise manipulation of single microparticles in an active area of 1 mm×1 mm by use of the optical tweezers.

The present application discloses use of optical/light images (e.g., a light image pattern) coupled (e.g., optically coupled) to an electrical surface (e.g., to a photoconductor or photoreceptor) with optionally active substrate (e.g. semiconductor) and projected thereon for creating virtual electrode and/or interconnects, which can avoid the need for pre-fabrication of an electrode.

Figure 1:
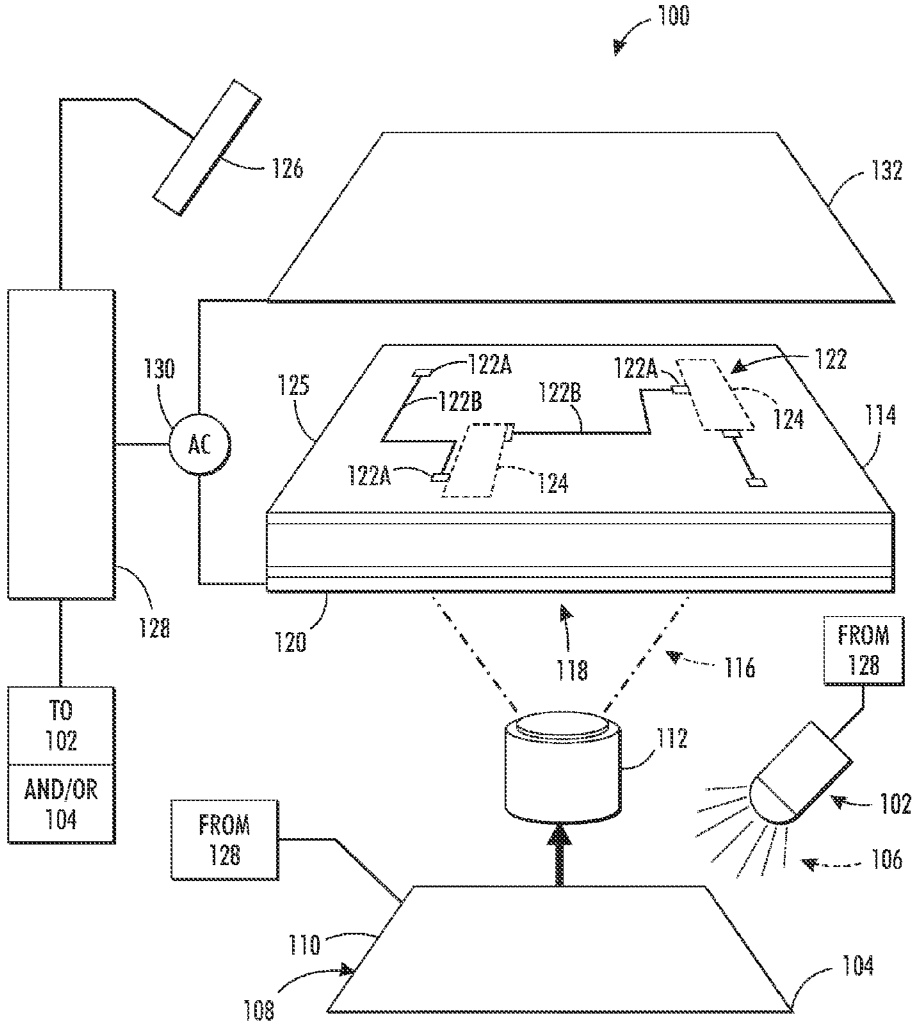
FIG. 1 is a schematic illustration of a virtual electrode array in a current interconnect grid pattern according to one aspect of the disclosure.

With reference to FIG. 1, shown is a schematic side view of one example of an optical based system 100 for generating dynamically, reconfigurable electrodes and interconnects on a photoconductive surface according to the present application.

The optical based system 100 comprises a light beam source 102 focused toward a microdisplay chip 104. The light beam source 102 can be any beam source operable to generate a light beam 106, such as a laser source, a light-emitting diode, halogen lamp, a charge coupling device or liquid crystal display, etc. for projecting a light image pattern. The microdisplay chip 104, upon which the light beam 106 can be focused is, in one arrangement, configured as an optical semiconductor device, such as a digital micro-mirror device (DMD), for example. The microdisplay chip 104 comprises a surface 108 comprising multiple microscopic mirrors (not shown) arranged thereon. The arrangement of mirrors on the surface 108 can be configured in the form of a rectangular (or other design) array, for example, for projecting an image 110. The microdisplay chip 104 can therefore generate various images in an optical manner corresponding to pixels in the image 110 to be projected.

The optical based system 100 further comprises a focusing component 112 for magnifying the image 110 projected by the microdisplay chip 104 onto a photoconductive component 114. The focusing component 112 generates a projection beam 116, and thereby, creates a projected light image pattern 118 on a bottom surface 120 of component 114. The light image in this embodiment representing a virtual electrode and/or interconnect pattern 122 comprising high-resolution, light-patterned, optically induced electrodes 122*a* and/or interconnects 122*b*. The interconnects have a high current conductivity in the range of several (or a few, e.g., three or more) milliamperes or more, depending on thermal management and specific device application. The size of these features (e.g., electrodes and inter-connects can vary and can be smaller than 100 μm.

In one embodiment, the virtual electrodes 112*a* and interconnects 122*b* connect discrete components 124, which are physically located on a top or upper surface 125 of photoconductor component 114. It is noted virtual electrode and/or interconnect pattern 122, corresponds to the light image pattern 118 (which in turn corresponds to image 110).

As in FIG. 1, electrodes 122*a* are positioned to come into operative contact with the discrete components 124 (in other words, a circuit is developed). The positioning of electrodes 122*a* so that they come into contact with the discrete components will now be described for at least one embodiment. In this design, a camera 126 images the top or upper surface 125 of the photoconductor component 114. So if, for example, the discrete components 124 have been placed on the top surface, images of their locations and their pin placements or other connection points are identified by the imaging system 126. This information is then provided to a computer/controller 128. The computer/controller 128 includes a processor which operates software that collects data related to the discrete device positions on upper surface 125 (it is mentioned that computer/controller 128 will also have software which controls the operation of supply 130).

The position data from computer/controller 128 is provided to microdisplay chip 104 to permit the generation of the image pattern 110. The computer/controller 128 can also be arranged to control operation of the light beam source 102.

Optical based system 100 comprises multiple layers for providing the photoconductive top or upper surface upon which a virtual electrode and/or interconnector pattern is provided. For example, in addition to the described elements including the photoconductor component 114, the system also includes a conductive layer 132 (e.g., indium-tin-oxide) on an insulation material, such as a glass. As can be seen from FIG. 1, the multi-phase voltage source 130 is in electrical communication with the photoconductive component 114 and the conductive layer 132. This allows voltage source 130 to apply a bias (e.g., an A.C. bias in the range of 500V to 1500V peak. The voltage source 130 also can apply an erase voltage between conductive layer 132 and the photoconductive component 114, which erases an image on the photoconductive surface. The erase voltage is applied at a frequency corresponding to a refresh rate or the images may be erased according to a photo induced discharge curve (PIDC). By this design, the electrode and/or interconnect pattern 122 may be erased and new different patterns implemented without a need to undertake fabrication processes. In one embodiment, the multi-phase voltage source 130 has a switching speed of 30 Hz to 240 Hz if driven using presentation software for a computer.

Figure 2:
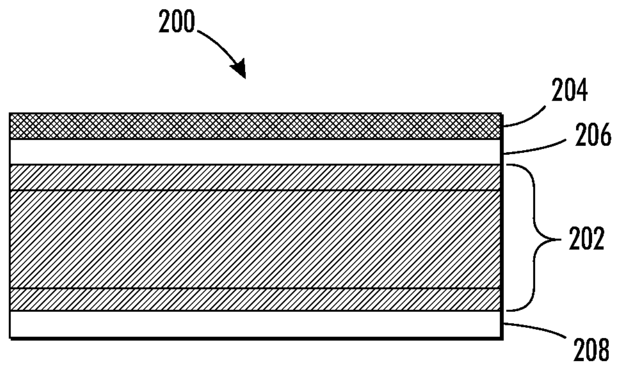
FIG. 2 is a schematic illustration of an optical structure according to one aspect of the disclosure.

The photoconductive component 114 comprises various featureless surfaces. For example, the photoconductor is, in one embodiment, a structure as depicted in FIG. 2. More particularly, FIG. 2 illustrates an optical device structure 200, which in one embodiment is used as the photoconductive component 114 of FIG. 1. Structure 200 is configured to convert photo-imaged charge patterns (not shown), formed from light image patterns projected onto a photodiode layer, into a conductance pattern. The optical device structure 200 comprises a photo-diode layer 202 and a semiconductor layer 204. The semiconductor layer 204 is operable to generate an electric field to control the shape and also the conductivity of a channel or current path of a particular type of charge carrier within semiconductor material. The semiconductor layer 204, for example, can be operable as a field effect semiconductor with an array of field effect transistors for generating conductance pathways for current.

The photo-diode layer 202 can be operable as a photodiode or photodiode array. In particular, the photo-diode can be configured to convert light into a current and/or a voltage. For example, when a photon of sufficient energy strikes the photo diode, the photon excites an electron, thereby creating a mobile electron and a positively charged electron hole. If the absorption occurs in the junction's depletion region (not shown), the carriers are swept from this junction by the built-in dielectric field of the depletion region. Holes will move toward one electrode (e.g., an anode), and electrons toward a different electrode (e.g., a cathode), and consequently, a photocurrent can be produced.

Further, the optical device structure 200 includes an insulator 206 region located between the semiconductor layer 204 and the photo-diode layer 202. At the bottom of the photo-diode layer 208 is a different insulation layer 208 comprising a glass, for example, with indium tin oxide as the conductor.

Figure 3:
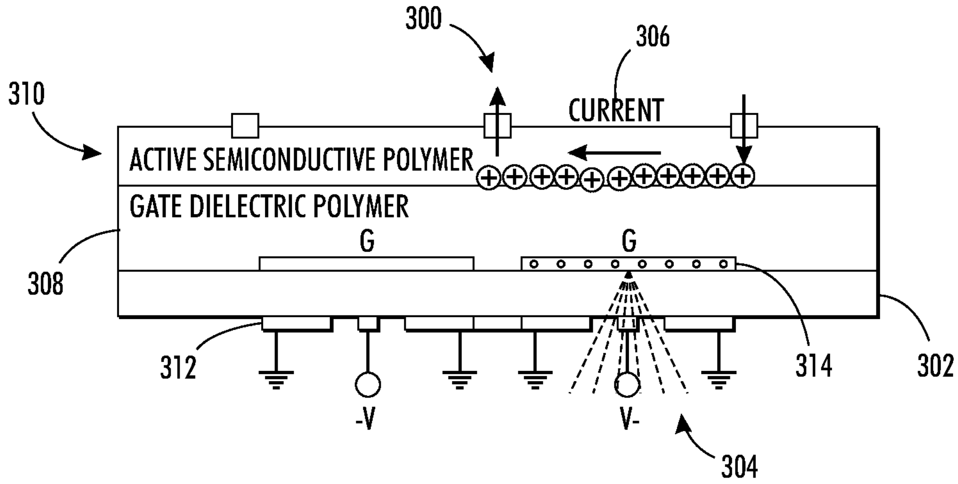
FIG. 3 is a schematic illustration of an optical structure according to one aspect of the disclosure.

Turning now to FIG. 3 illustrated is another optical device structure 300 (which may be implemented in a system such as that of FIG. 1). Structure 300 includes a photoconductive polymer layer 302 where an optical image pattern 304 is projected thereon. The optical pattern 304 can comprise multiple traces or points of light other than the one illustrated in FIG. 3, for example. As a result of the optical pattern projected on the layer 302, charge patterns corresponding to the optical pattern can form 2D array of electrostatic voltages. With appropriate gating voltages, the optical structure 300 can further implement the photoconductive polymer layer 302 to thus provide a conductive pathway (i.e., an interconnect) for a current flow 306.

The 2D array optical structure 300 also comprises a layer that creates a dielectric, such as a gate dielectric polymer 308, for turning on and off an inversion region through a voltage threshold and allow the current flow 306 to follow a Manhattan grid array pattern (such as pattern 400 of FIG. 4), for example. Further, a photo-diode array may be provided within the gate dielectric layer 308, and the current flow 306 can follow a Manhattan grid array pattern where current flows in a rectangular pattern along a pathway that can correspond to the light image pattern projected at the photoconductive layer 302.

Figure 4:
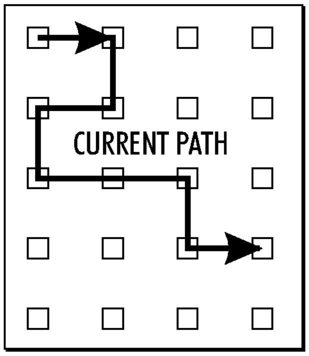
FIG. 4 is a schematic illustration of an optical structure according to one aspect of the disclosure.

Adjacent to the gate dielectric polymer 308 is an active semiconductive polymer layer 310 for providing a conductive pathway for current flow, such as in the Manhattan grid array pattern 400 of FIG. 4. The semiconductive polymer layer 310 of FIG. 3 of FIG. 3 comprises an array of photo-diodes for converting the photo image patterns projected onto the photoconductive layer 302 to a conductance pattern for a current flow 306. The conductance pattern is configured in accordance to the light image patterns projected. The light image pattern 304, for example, can optically induce electrodes forming a virtual electrode array of multiple electrostatic voltages that vary based on intensity of illumination. The pattern is dynamically reconfigurable and transient, thereby causing the electrodes and interconnects therebetween to also be dynamically reconfigurable and transient. Multiple light patterns can therefore be projected into the device 300 in a sequence of light image patterns and form various dynamically, reconfigurable currents and voltages that transiently change pattern.

Figure 5:
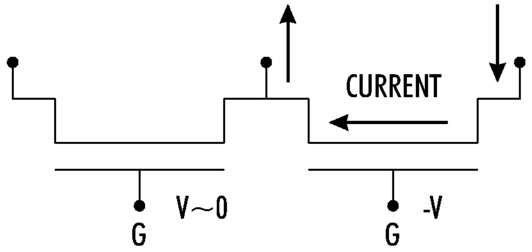
FIG. 5 is a circuit description of FIG. 4.

In addition, connections 312 made of aluminum, for example, can be coupled to the photoconductive polymer layer 302. Insulators 314 can be located on an opposite side of the layer 302 with respect to the aluminum connections. The photoconductive layer 302 can therefore operate as a floating electrode photoconductive polymer optical electronic device for high voltage applications. FIG. 5 depicts a circuit interpretation 500 of the structure of FIG. 3.

Consequently, the device structure 300 of FIG. 3 comprises an optically switched circuitry on spatially and temporally reconfigurable substrates, where the circuitry is optically induced. The electrodes and interconnects provided within the layers of device 300 can reconfigure spatially, and vary over time for a temporal reconfiguration therein. Moreover, little to no integrated chip fabrication of electrodes and/or interconnects is necessary as would be needed with traditional printed circuit boards.

The micro-assemblies can be delivered to an upper surface of the photoconductive component in a particular orientation and/or in a non-organized conglomeration. In either case, the described optical based systems (e.g., 100 of FIG. 1, 300 of FIG. 3, as well as others to be described herein) form images, to generate virtual electrodes and interconnections to make the desired connections of conductive paths. Systems as described above find particular application in the testing of discrete devices. In this situation, the devices may be placed on the upper surface in an organized or non-organized manner. Then images on the upper surface are used to generate the electrode/interconnect patterns. In one arrangement, the patterns make connections that allow for testing of the discrete devices. Further, printed circuit boards for massive parallel assembly can also be combined through interconnects that result from an optically induced trace pattern projected into the photoconductive layer 302, such as the light image pattern 304, for example. The present disclosure is not limited to any particular implementation described herein, and may be utilized for a variety of devices and methods using virtual electrodes and/or virtual interconnects on polymer and semiconductive substrates.

Figure 6:
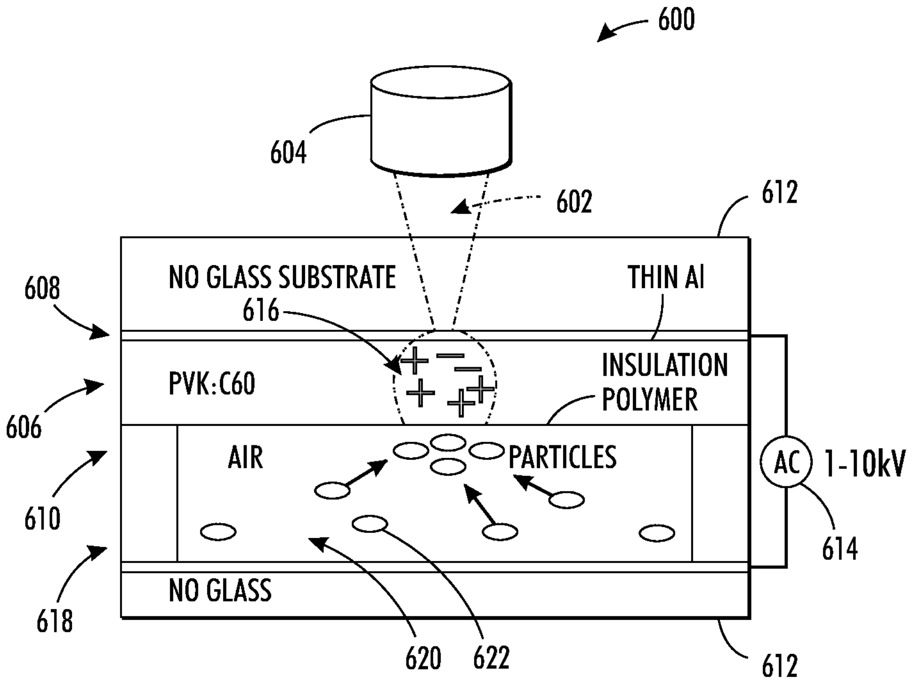
FIG. 6 is a schematic illustration of an optical structure according to one aspect of the disclosure.

Referring now to FIG. 6, illustrated is a featureless photoconductive polymer substrate in a portion of an optical device 600 (similar in concept to the device of FIG. 1) in which optically projected light patterns can be projected thereon to form a virtual array of electrodes and interconnects. The optical device 600 illustrated herein can comprise the photoconductive layer referred to in FIG. 3 and utilized in conjunction therewith. For example, a light image beam pattern 602 is projected through an objective lens 604 (e.g., a microscope objective) from a light source (not shown) onto a photoconductive layer 606.

The optical device 600 can comprise the photoconductive layer 606 configured to receive the light image pattern 602 and generate an electrostatic voltage charge along the pattern. The photoconductive layer 606 in one example can comprise a poly vinylcarbozole material doped with a fullerene chain (e.g., PVK:C60). The poly vinylcarbozole material can be sensitive to optical images and create dielectric properties for converting light images into electrostatic voltages. The optical device 600 can comprise an insulation layer 610 comprising an insulation polymer and a thin layer 608 of an aluminum substance. A conductor-on-glass substrate layer 612 (e.g., indium tin oxide on glass) can be located at two sides of the optical device 600.

An AC bias from voltage source 614 can be applied between the glass substrate layer 612 and the layer 608 of aluminum, where the respective layers act as electrodes between the photoconductive layer and a particulate layer 618. The particulate layer 618 can comprise a medium 620 (e.g., an air or liquid medium) having particulates 622 (e.g., organic or inorganic particulates of matter). The particulate layer 618 can comprise spacer material on opposite sides of the layer for insulating the medium 620 and particulates 622 within.

Figure 7:
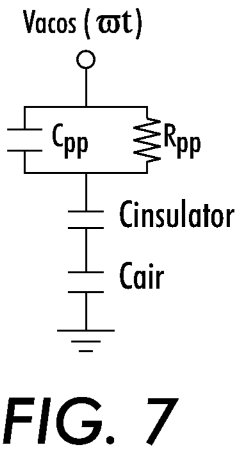
FIG. 7 is a circuit description of FIG. 6.

Optically induced electrodes 616 can be generated within the photoconductive layer 606 configured in a virtual electrode array corresponding in pattern to the light image pattern 602 projected thereon and comprise dynamically reconfigurable electrodes. The electrodes therein can be implemented to move toner or other inorganic and/or organic particles, as well as forming electrodes for other assemblies discussed above. The device 600 can allow for low power and longer life in greener technologies. For example, self-assemblies can be manufactured on actively driven surfaces for electrostatics in air as well as electrophoretic-dielectrophoretic-electro-kinetic manipulation in fluids. FIG. 7 depicts an equivalent circuit model 700 of the optical device 600 of FIG. 6.

Figure 8:
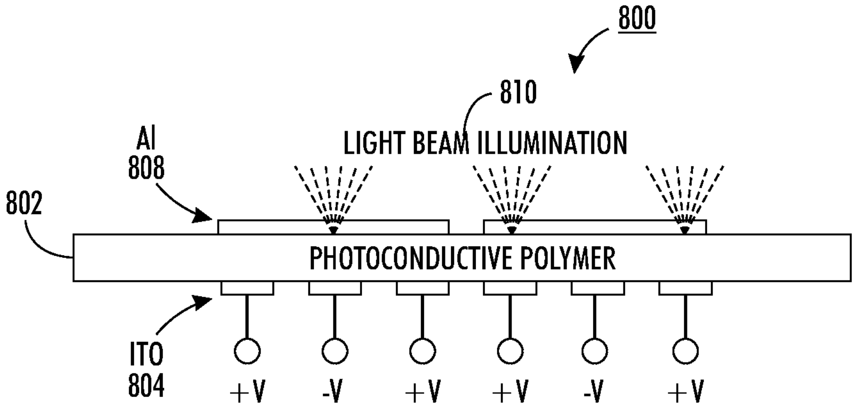
FIG. 8 is a schematic illustration of a floating electrode photoconductive polymer OET for HV applications.
Figure 9:
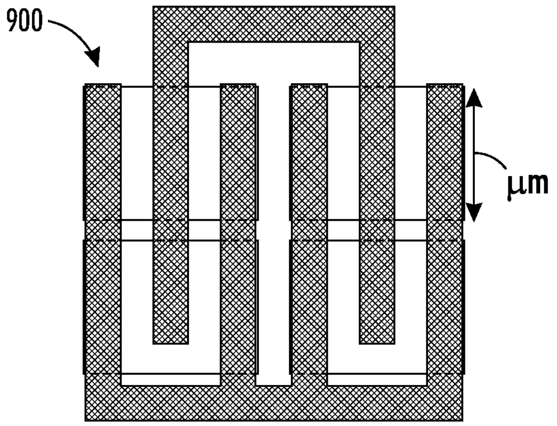
FIG. 9 depicts a top view of FIG. 8.
Figure 10:
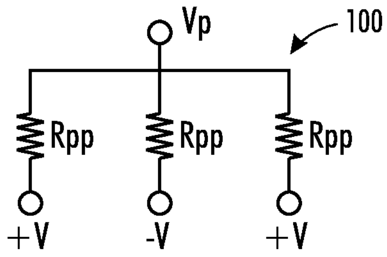
FIG. 10 is a circuit description of FIGS. 8 and 9.

Turning to FIG. 8, illustrated is a schematic cross-section of a floating electrode photoconductive polymer OET device 800 for use in high voltage applications. A photoconductive polymer 802 has ITO islands 804 to which voltage input connections 806 are formed. Aluminum islands (Al) 808 are formed on the top surface, which is provided with light beam illumination 810 in order to form the electrode and interconnect patterns such as in previous discussions. FIG. 9 provides a top view 900 of the FEP-OET device 800, and FIG. 10 is an equivalent circuit model 1000 of the FEP-OET device. The floating voltage $V_F$ is controlled by the location's intensity of illumination light beams 810 of FIG. 8.

Figure 11:
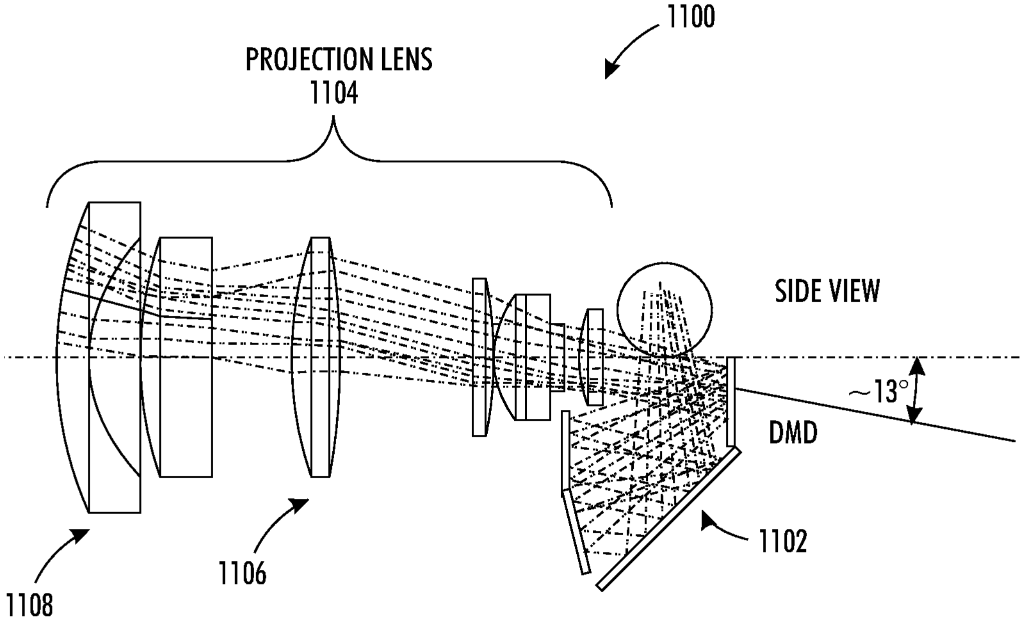
FIG. 11 is a schematic illustration of a projection system according to one aspect of the disclosure.

FIG. 11 illustrates a projection system 1100 comprising various lens designs for projecting a light image pattern onto a photoconductor. The projection system 1100 can comprise a microdisplay chip 1102, such as a DMD device that images a projected image directly onto a photoconductive substrate 1104. The system 1100 can comprise a projection lens 1106 comprising a flat field (PLAN) microscope objective 1108 and can comprise additional lenses 1110 for re-imaging onto a photoconductive component, for example, where the image field may be limited to 1.4 mm to 2.8 mm. Due to a small field of view, a microscope objective can be offset and tilted. For example, a projection offset angle can be about 13°.

In one embodiment, the projection optical arrangement is operable to provide a page sized image projection onto a photoconductor. For example, an 8½×11 inch area (or for A3, A4 page sizes, among others) can be projected onto the photoconductor by the projector optics.

Figure 12:
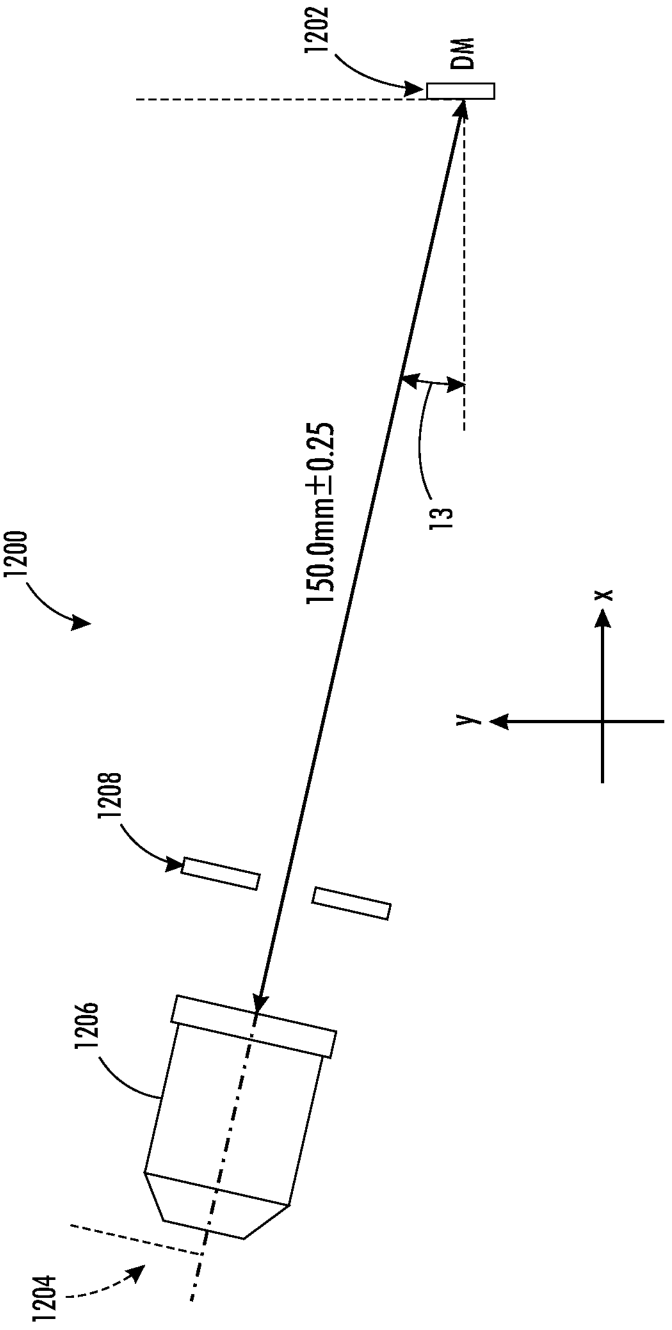
FIG. 12 is a schematic illustration of a projection system according to one aspect of the disclosure.

FIG. 12 illustrates another example of an optical layout 1200. Images can be projected at a projector DMD 1202 and an image plane 1204, for example, through a microscope objective 1206. The microscope objective 1206 comprises a plus or minus 5 mm x and y adjustment, for example, and aligned at an angle offset (e.g., about 13°). In addition, a stray light baffling 1208 is implemented along the path of projection between the microscope objective and the projector DMD.

In one embodiment, the objective lens assembly comprises an additional lens that is a flat field microscope objective to account for an offset angle of the microdisplay.

Figure 13:
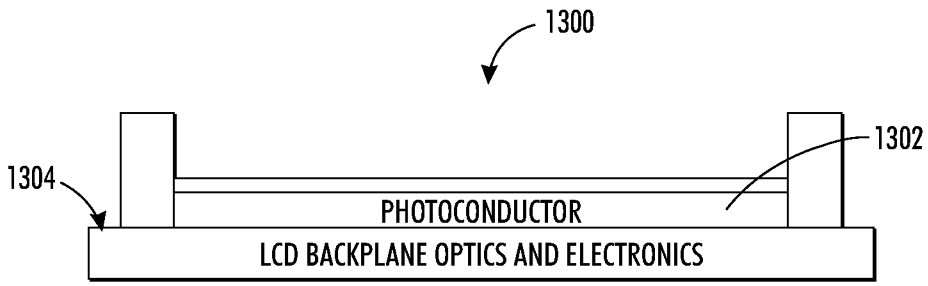
FIG. 13 is a schematic illustration of an optical assembly according to one aspect of the disclosure.

FIG. 13 illustrates an optical assembly 1300 of a photoconductive layer 1302 with a display panel 1304 (e.g., a liquid crystal (LCD) display) on a side of and in operational association with the photoconductive. The assembly 1300 can be implemented in conjunction with the device 100 of FIG. 1 and/or with the structure 300 of FIG. 3 (in place of the previously discussed optical systems). For example, the display 1304 can be configured to project images, such as light image patterns onto the photoconductive layer. The display panel 1304 can project a page sized image pattern onto the photoconductive layer for optically induced virtual electrodes and interconnects to be created thereat. Optical patterns can produce voltages and/or current pathways corresponding in shape to the virtual pattern.

The display panel 1304 can be an LCD display panel that may be a 22 inch diagonal screen of lesser or greater size. Various page sizes may be implemented and/or projected by the display panel (e.g., 8½×11 inch sizes). For example, an aspect ratio of 16:10 can be provided by the panel 1304 for projecting A4, A3 size images, among others.

Figure 14:
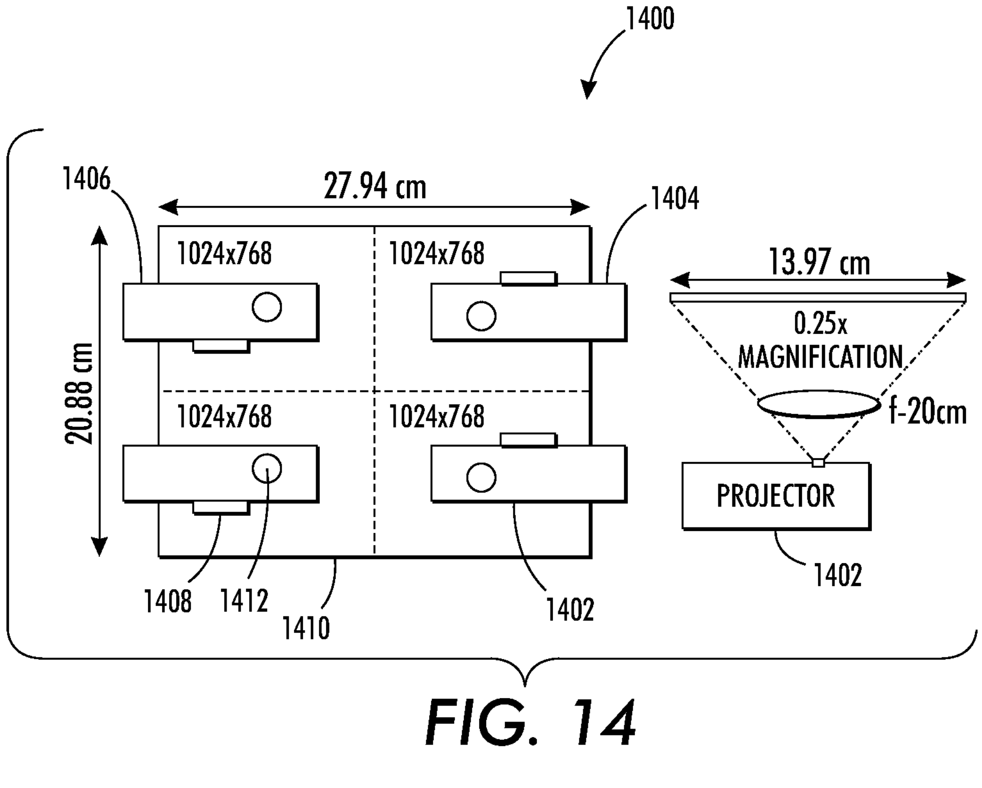
FIG. 14 is a schematic illustration of a projection system according to one aspect of the disclosure.

FIG. 14 illustrates an aspect of an optical projection system 1400 of the present disclosure operable to project images that are page sized onto a photoconductive layer for an optimal grid layout. The optical projection system 1400 comprises several screen areas, for example, that can be 1024×768 pixel sized area. Four different projectors 1402, 1404, 1406, and 1408 can be coupled together to project respective images on a screen area 1410, for example. Images from the four projectors can be software-stitched together in a 2×2 array. A total area can be approximately 20.88 cm by 27.94 cm with the individual respective areas approximately 13.97 cm wide and 10.44 cm high. An extra lens (e.g., a convex lens) can be placed in front of respective projectors 1402-1408 in order to de-magnify a minimum size image to a 13.97 by 10.44 cm area, which can match a size of a quarter of a page sized image.

Figure 15:
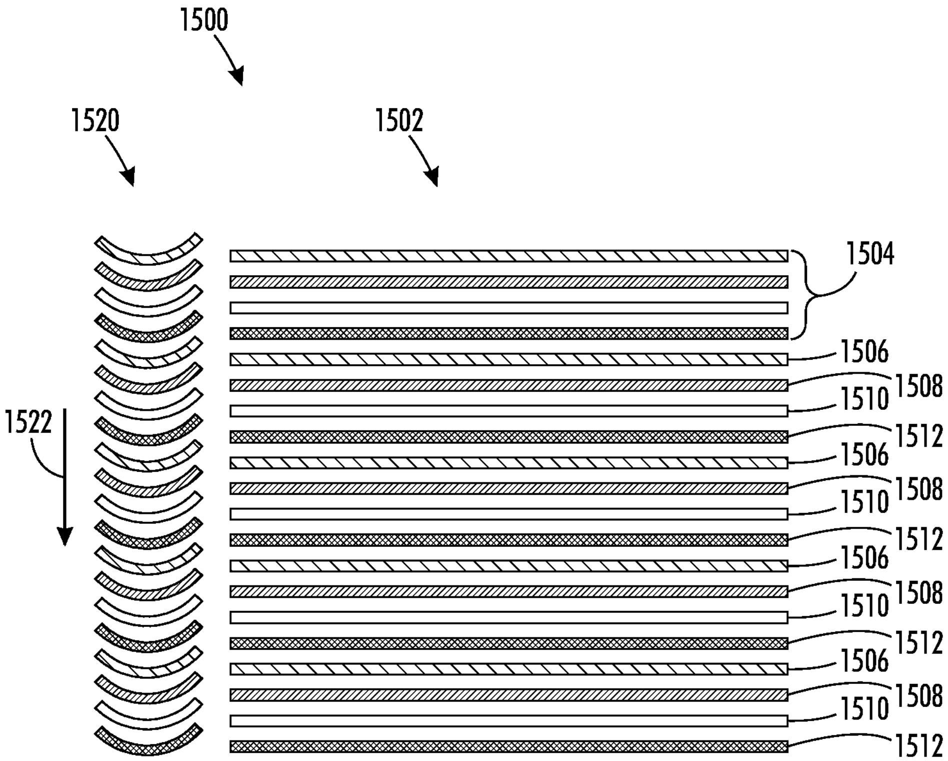
FIG. 15 is a schematic illustration of a transport apparatus according to one aspect of the disclosure.

FIG. 15 illustrates on example of a light image pattern 1500 of a virtual electrode grid array comprising optically induced electrodes, which can be implemented using the above teachings. The optically induced electrodes can comprise a traveling wave grid pattern 1502 comprising a transient electrode pattern 1504 comprising a sequence of light image patterns 1506, 1508, 1510, and 1512, for example. The transient electrode pattern 1504 can be an optical pattern that is configured to change dynamically without pause of the system where projected (e.g., a develop system discussed above).

In one embodiment, the transient electrode pattern 1504 comprises a sequence of light image patterns 1506, 1508, 1510, and 1512. The sequence of light image patterns can be configured to change dynamically in time without pause of the system and in a sequence with respect to one another in order to propagate toner particles. For example, referring to FIG. 1 a traveling wave may be optically induced by optically induced electrodes on the photoconductive component 114 by the pattern 1506 being projected thereon for generating a traveling wave of a first phase, and then a second traveling wave pattern may be produced by a second light image pattern 1508 optically projected thereafter for generating a traveling wave of a second phase. In this manner, a third traveling wave of a third phase can be generated by a third pattern 1510 of and a fourth phase by this pattern 1512. In one embodiment, the traveling wave grid pattern 1502 comprises light image patterns configured to be rectilinear in shape. Alternatively, a traveling wave grid pattern 1520 can be implemented in a system for transporting particles (e.g., inorganic or organic particles), similar in manner to the traveling wave grid pattern 1502, although in a chevron grid pattern, which can focus particles while also moving them up and down in a direction 1522.

It will be appreciated that various embodiments of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. An optical electrical device for converting a photo image pattern to a conductance pattern providing virtual electrodes and virtual interconnects, comprising:

- a lighting arrangement for generating a predetermined optical image in the form of a virtual electrode and virtual interconnect pattern;
- a photoconductive component including a photoconductive layer, and active semiconductor layer and an insulating layer, the photoconductive component positioned to receive the optically induced virtual electrode and virtual interconnect pattern projected therein, and configured to form a charge where the virtual electrode and virtual interconnect pattern is received;
- a positioning arrangement configured to position the virtual electrode and virtual interconnect pattern at a predetermined location on the photoconductive component to allow for connection to connection points of discrete components; and
- an erasure component positioned and configured to erase the images on the photoconductive component.

2. The system of claim 1, wherein the photoconductive layer comprises an optically induced conductive trace pattern projected therein.

3. The system of claim 1, wherein the semiconductor layer comprises a field effect transistor array comprising at least one conductance path for controlling the flow of a charge between virtual electrodes and virtual interconnects.

4. The system of claim 1, wherein the dielectric layer comprises a photodiode layer configured to convert a virtual interconnect pattern forming the virtual interconnects to an optically induced conductive trace pattern to allow a current flow thereat.

5. The system of claim 1, comprising an insulating layer located between the dielectric layer and the semiconductor layer.

6. The system of claim 1, comprising a liquid crystal display image projector or a charge-coupled device on a backside of the photoconductive layer comprising the optically induced virtual electrode pattern and an optically induced conductive trace pattern for projecting into the photoconductive layer.

7. The system of claim 6, wherein the optically induced virtual electrode pattern and optically induced conductive trace pattern comprise a page sized image projected to the photoconductive layer.

8. The system of claim 1, comprising four projectors coupled together in an array for projecting a page sized image to the photoconductor, wherein the projectors respectively comprise a convex lens located in front of the respective projector to de-magnify an image size projected to a size comprising a quarter of the page sized image.

9. The system of claim 1, further including a voltage source providing an AC bias in a range of 500V to 1500V peak.

10. The system of claim 1 wherein a feature size of the virtual electrodes and virtual interconnects are less than 100 μm.

11. The system of claim 1 wherein a current conductivity of the virtual interconnects is in the range of a few milliamperes.

12. The optical electronic circuit device of claim 1, wherein the photoconductive polymer comprises a fullerene (C60) poly vinylcarbazole (PVK:C60).

13. An optical based system having virtual electrodes and virtual interconnects:

- a light beam source for generating a light beam;
- a microdisplay chip configured to receive the light beam from the light beam source, wherein the microdisplay chip is positioned and configured to project an image of a virtual electrode and virtual interconnect pattern;
- a focusing component configured to generate a projection beam of the virtual electrode and virtual interconnect pattern from the projected image of the microdisplay chip;
- a photoconductive component positioned to receive the projection beam, to create a projected light image pattern in the photoconductive component, the projected light image defining a virtual electrode and virtual interconnect pattern; and a camera arrangement positioned to image a top surface of the photoconductive component.

14. The system of claim 13 further including discrete components positioned on the upper surface of the photoconductive component, wherein the camera arrangement is configured and positioned to image the discrete components including corresponding connection locations of the discrete components.

15. The system of claim 14 further including a computer controller configured to receive position data corresponding to the image of the top surface of the photoconductive component, including the position data of the corresponding connection locations of the discrete components.

16. The system of claim 15 further including a data connection between the computer controller and the microdisplay, wherein the computer controller is configured to control the microdisplay based on the position data.

17. The system of claim 1 further including a conductive layer positioned within operational range of the upper surface of the photoconductive layer, wherein the conductive layer is configured to generate an erasure signal to erase the virtual electrode and virtual interconnect pattern.

18. The system of claim 1 wherein the photoconductive component includes:

a photo-diode layer;

a semi-conductor layer;

a first insulator layer located between a surface of the semiconductor layer and a surface of the photo-diode layer; and a second insulation layer located on another surface of the photo-diode layer.

* * * * *